US007715573B1

(12) United States Patent
Yonemoto et al.

(10) Patent No.: US 7,715,573 B1
(45) Date of Patent: May 11, 2010

(54) AUDIO BANDWIDTH EXPANSION

(75) Inventors: Akihiro Yonemoto, Ibaraki (JP); Ryo Tsutsui, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 1109 days.

(21) Appl. No.: 11/364,219

(22) Filed: Feb. 28, 2006

Related U.S. Application Data

(60) Provisional application No. 60/657,234, filed on Feb. 28, 2005, provisional application No. 60/749,994, filed on Dec. 13, 2005, provisional application No. 60/756,099, filed on Jan. 4, 2006, provisional application No. 60/660,372, filed on Mar. 9, 2005.

(51) Int. Cl.
*H03G 5/00* (2006.01)
*H03G 7/00* (2006.01)

(52) U.S. Cl. ............................ 381/98; 381/106; 333/14

(58) Field of Classification Search ................... 381/61, 381/94.1, 94.5, 94.7, 98, 106; 333/14; 455/72; 700/94
See application file for complete search history.

(56) References Cited

U.S. PATENT DOCUMENTS

| | | | | |
|---|---|---|---|---|
| 3,845,416 A * | 10/1974 | Dolby | 333/14 |
| 4,398,157 A * | 8/1983 | Dieterich | 330/86 |
| 4,893,099 A * | 1/1990 | Waller, Jr. | 333/17.1 |
| 5,633,939 A * | 5/1997 | Kitani et al. | 381/106 |
| 5,881,157 A * | 3/1999 | Lee et al. | 381/98 |
| RE38,003 E * | 2/2003 | Hiroyuki | 84/661 |
| 6,552,591 B1 * | 4/2003 | Abadi et al. | 327/306 |
| 6,914,987 B2 * | 7/2005 | Blind et al. | 381/13 |
| 2005/0094828 A1 * | 5/2005 | Sugimoto | 381/98 |

* cited by examiner

*Primary Examiner*—Xue Mei
(74) *Attorney, Agent, or Firm*—Mirna G. Abyad; Wade J. Brady, III; Frederick J. Telecky, Jr.

(57) ABSTRACT

Bandwidth expansion for audio signals by frequency band translations plus adaptive gains to create higher frequencies; use of a common channel for both stereo channels limits computational complexity. Adaptive cut-off frequency determination by power spectrum curve analysis, and bass expansion by both fundamental frequency illusion and equalization.

6 Claims, 9 Drawing Sheets

AUDIO BANDWIDTH EXPANSION

CROSS-REFERENCE TO RELATED APPLICATIONS

This application claims priority from provisional applications Nos. 60/657,234, filed Feb. 28, 2005, 60/749,994, filed Dec. 13, 2005, and 60/756,099, filed Jan. 4, 2006. Co-assigned, patent application No. 60/660,372, filed Mar. 9, 2005 discloses related subject matter.

BACKGROUND OF THE INVENTION

The present invention relates to digital signal processing, and more particularly to audio frequency bandwidth expansion.

Audio signals sometimes suffer from inferior sound quality. This is because their bandwidths have been limited due to the channel/media capacity of transfer/storage systems. For example, cut-off frequencies are set at about 20 kHz for CD, 16 kHz for MP3, 15 kHz for FM radio, and even lower for other audio systems whose data rate capability are poorer. At playback time, it is beneficial to recover high frequency components that have been discarded in such systems. This processing is equivalent to expanding an audio signal bandwidth, so it can be called bandwidth expansion (BWE); see FIG. 2*a*. One approach to realize BWE is to first perform fast Fourier transform (FFT) on band-limited signals, shift the spectrum towards high frequencies, add the high frequency portion of the shifted spectrum to the unmodified spectrum above the cut-off frequency, and then perform inverse FFT (IFFT). The third operation can be understood as weighting the frequency-shifted spectrum with zero below the cut-off frequency and then adding it to the unmodified spectrum; see FIG. 2*c*. The problem with this method is that, time domain aliasing is caused due to the plain frequency domain weighting. This can lead to perceptual distortion. A possible solution that eases this problem could be to apply overlap-add methods. However, these methods are incapable of complete suppression of aliasing.

On the other hand, time domain processing for BWE has been proposed in which high frequency components are synthesized by using amplitude modulation (AM) and extracted by using a high-pass filter. This system performs the core part of high frequency synthesis in time domain and is time domain alias-free. Another property employed is to estimate the cut-off frequency of input signal, on which the modulation amount and the cut-off frequency of the high-pass filter can be determined in run-time depending on the input signal. BWE algorithms work most efficiently when the cut-off frequency is known beforehand. However, it varies depending on signal content, bit-rate, codec, and encoder used. It can vary even within a single stream along with time. Hence, a run-time cut-off frequency estimator, as shown in FIG. 2*d*, is desired in order for the BWE algorithms to adaptively synthesize the high frequency components that were cut-off at time-varying frequency. To estimate the cut-off frequency, one known method applies an FFT to a section of an input signal, and identifies the cut-off frequency as the highest frequency contained in the signal. Namely, it seeks the highest frequency at which the spectrum crosses a predefined threshold. This method is very simple, but a small threshold will be susceptible to noise and a large threshold will fail for small input signals. Another problem is that, even if there is no real cut-off in the input spectrum, the simple method would identify an inappropriate frequency as the cut-off frequency. Consider the case where the spectrum gradually declines toward the Nyquist frequency and the spectrum crosses the threshold at a certain frequency. Then, BWE algorithms will generate unwanted high frequencies, which could result in audible distortion, over the already existing high frequency components of the input signal.

Another bandwidth problem occurs at low frequencies: bass loudspeakers installed in electric appliances such as flat panel TV, mini-component, multimedia PC, portable media player, cell-phone, and so on cannot reproduce bass frequencies efficiently due to their limited dimensions relative to low frequency wavelengths. With such loudspeakers, the reproduction efficiency starts to degrade rapidly from about 100-300 Hz depending on the loudspeakers, and almost no sound is excited below 40-100 Hz; see FIG. 2*f*. To compensate for the degradation of the bass frequencies, various kinds of equalization techniques are widely used in practice. Although equalization can help reproduce the original bass sound, the amplifier gain for the bass frequencies may be excessively high. As a result, it could overdrive the loudspeaker, which may cause non-linear distortion. Also, the dynamic range of the equalized signal would become too wide for digital representation with finite word length. Another technique for bass enhancement is to invoke a perception of the bass frequencies using a psycho-acoustic effect, so-called "missing fundamental". According to the effect, a human brain perceives the tone of the missing fundamental frequency when its higher harmonics are detected. Hence, by generating higher harmonics, one can give the perception of bass frequencies with loudspeakers that are incapable of reproducing them. The missing fundamental effect, however, gives only a "pseudo tone" of the fundamental frequency. The overuse of the effect for a wide range of frequencies leads to unnatural or unpleasant sound. As for the harmonics generation, various techniques are known in the literature: rectification, clipping, polynomials, non-linear gain, modulation, multiplicative feedback loop, and so on. In most cases, since those techniques are based on non-linear operations, an envelope estimator is desired that obtains the input signal level to generate harmonics efficiently. For example, when clipping a signal, the clipping threshold is critical to the amount of harmonics generated. Consider the case when the threshold is fixed for any input signal. Then, the amount of harmonics will be zero or insufficient for small input signal, and too much for large input signal.

SUMMARY OF THE INVENTION

The present invention provides audio bandwidth expansion with adaptive cut-off frequency detection and/or a common expansion for stereo signals and/or even-odd harmonic generation for part of low frequency expansion.

DESCRIPTION OF THE PREFERRED EMBODIMENTS

1. Overview

Preferred embodiment methods include audio bandwidth extensions at high and/or low frequencies. Preferred embodiment high-frequency bandwidth expansion (BWE) methods include amplitude modulation and a high-pass filter for high frequency synthesis which reduces computation by making use of an intensity stereo processing in case of stereo signal input. Another BWE preferred embodiment estimates the level of high frequency components adaptively; this enables smooth transition in spectrum from original band-limited signals to synthesized high frequencies with a more natural sound quality.

Further preferred embodiments provide for the run-time creation of the high-pass filter coefficients, use of windowed sinc functions that requires low computation with much smaller look-up table size for ROM. This filter is designed to have linear phase, and thus is free from phase distortion. And the FIR filtering operation is done in frequency domain using the overlap-save method, which saves significant amount of computation. Some other operations including the AM operation are also converted to frequency domain processing so as to minimize the number of FFT operations.

In particular, a preferred embodiment method first identifies a cut-off frequency, as the candidate, with adaptive thresholding of the input power spectrum. The threshold is adaptively determined based on the signal level and the noise floor that is inherent in digital (i.e., quantized) signals. The use of the noise floor helps discriminate the presence of high frequencies in input signals. To verify the candidate cut-off frequency, the present invention then detects the spectrum envelope around the candidate. If no 'drop-off' is found in the spectrum envelope, the candidate will be treated as a false cut-off and thus discarded. In that case, the cut-off frequency will be identified as the Nyquist frequency $F_S/2$. All the processing is done in the decibel domain to emphasize the drop-off in spectra percentage and to estimate the cut-off frequency in a more robust manner.

Figure 3B:
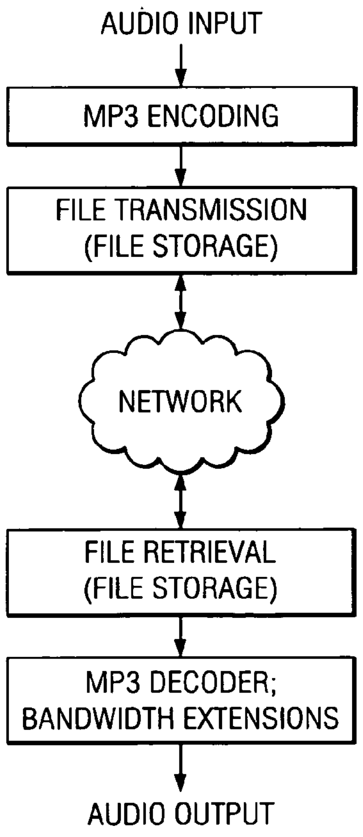
FIG. 3b (PRIOR ART)
FIGS. 3*a*-3*b* illustrate a processor and network communications.
Figure 3A:
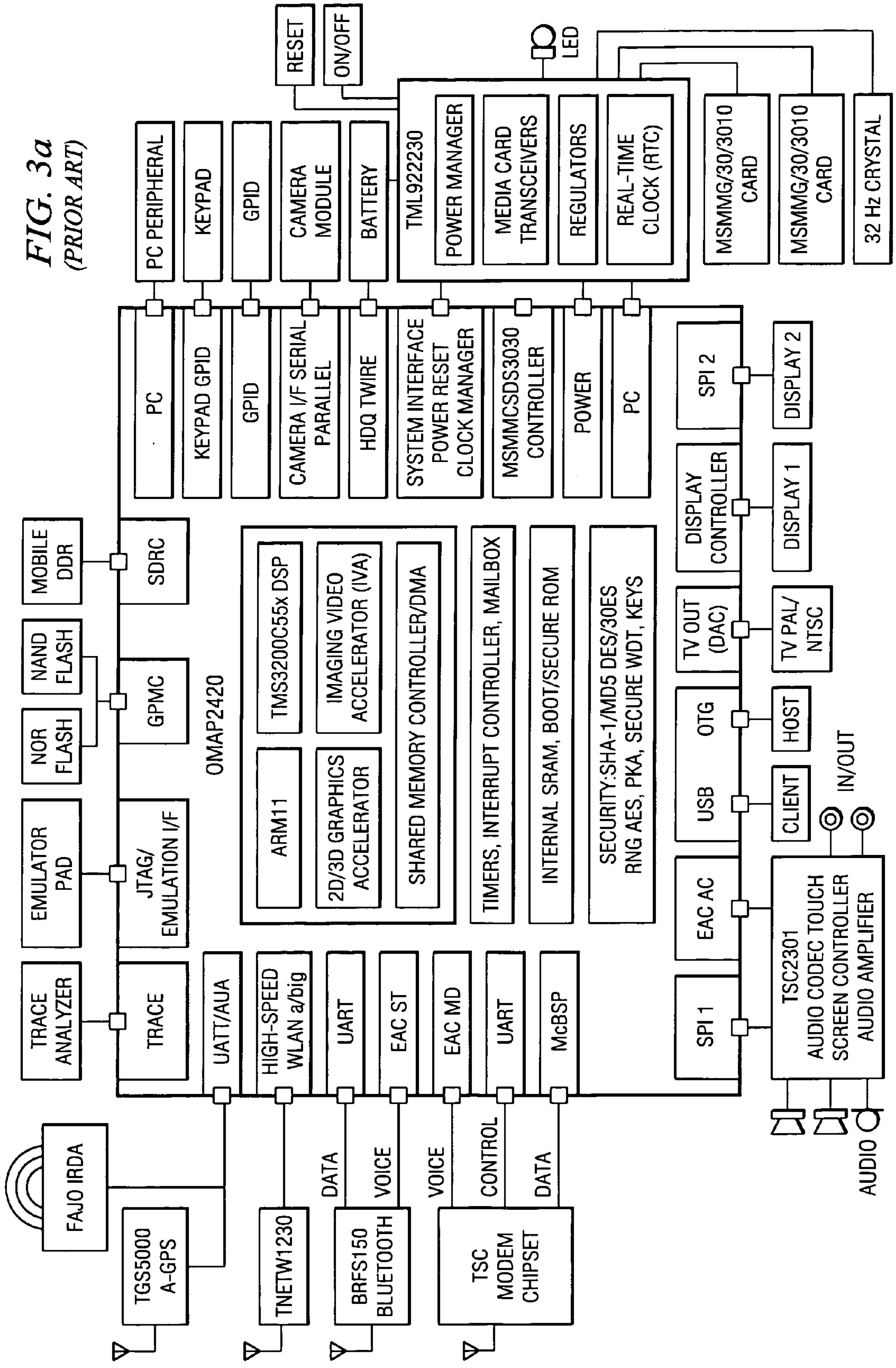
FIG. 3a (PRIOR ART)

Preferred embodiment systems perform preferred embodiment methods with any of several types of hardware: digital signal processors (DSPs), general purpose programmable processors, application specific circuits, or systems on a chip (SoC) which may have multiple processors such as combinations of DSPs, RISC processors, plus various specialized programmable accelerators; see FIG. 3*a* which illustrates a processor with multiple capabilities. A stored program in an onboard or external (flash EEP)ROM or FRAM could implement the signal processing. Analog-to-digital converters and digital-to-analog converters can provide coupling to the real world, modulators and demodulators (plus antennas for air interfaces) can provide coupling for transmission waveforms, and packetizers can provide formats for transmission over networks such as the Internet; see FIG. 3*b*.

2. Single-Channel AM-Based BWE With Adaptive Signal Level Estimation

Preferred embodiment methods and devices provide for stereo BWE using a common extension signal. Thus, initially consider preferred embodiment BWE for a single channel system, this will be the baseline implementation for the preferred embodiment stereo-channel BWE. We adopt the AM-based BWE method due to its good sound quality and lower computation complexity.

Figure 2A:
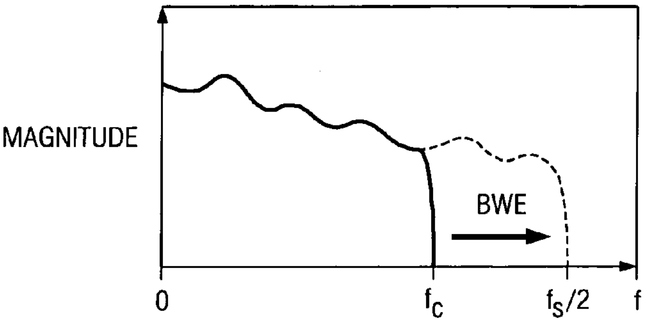
FIG. 2a (PRIOR ART)
FIGS. 2*a*-2*g* show known spectra and bandwidth extensions.
Figure 2B:
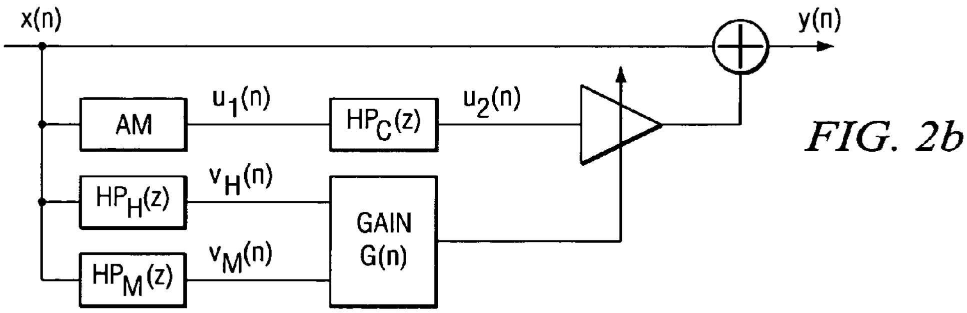

FIG. 2*b* shows the block diagram. First, let us assume that the input signal x(n) has been sampled with sampling frequency $F_S$ Hz and low-pass filtered with a filter having cut-off frequency $F_C$ Hz. Of course, $$F_C<F_S/2=F_N$$

where $F_N$ denotes the Nyquist frequency. For example, typical sampling rates are $F_S$=44.1 or 48 kHz, so $F_N$=22.05 or 24 kHz; whereas, $F_C$ may be about 16 kHz, such as in MP3.

In the figure, $u_1(n)$ is output from the amplitude-modulation block AM (more precisely, cosine-modulation). Let the block AM be a point-wise multiplication with a time varying cosine weight:

$$u_1(n)=\cos[2\pi f_m n/F_S]x(n)$$

where $f_m$ represents the frequency shift amount (known as a carrier frequency for AM) from the input signal. The behavior of this modulation can be graphically analyzed in the frequency domain. Let X(f) be the Fourier spectrum of x(n) defined as $$X(f)=\Sigma_{-\infty<n<\infty}x(n)\exp[-j2\pi fn]$$

and let $U_1(f)$ be the Fourier spectrum of $u_1(n)$ defined similarly. Then the modulation translates into:

$$U_1(f)=\tfrac{1}{2}X(f-f_m/F_S)+\tfrac{1}{2}X(f+f_m/F_S)$$

This shows that $U_1(f)$ is composed of frequency-shifted versions of X(f). The top two panels of FIG. 2*c* show the relation graphically, where it can be seen that $U_1(f)$ contains frequency components outside of the spectral band of X(f) (above $F_C$ and below $-F_C$).

As shown in FIG. 2*b*, the signal $u_1(n)$ is then high-pass filtered by $HP_C(z)$, whose cut-off frequency has to be chosen around $F_C$, yielding $u_2(n)$. The role of $HP_C(z)$ is to preserve the original spectrum under the cut-off frequency $F_C$ when x(n) is mixed with $u_2(n)$. By mixing x(n) with $u_2(n)$, we obtain the band-expanded signal (see the spectrum of $U_2(f)$ shown in the lower left panel of FIG. 2*c*).

Figure 2C:
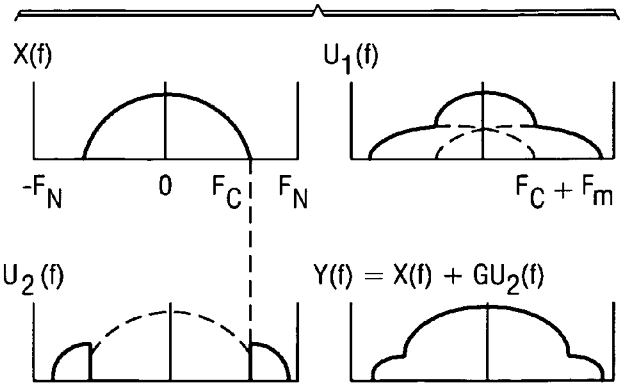
FIG. 2c (PRIOR ART)
Figure 2D:
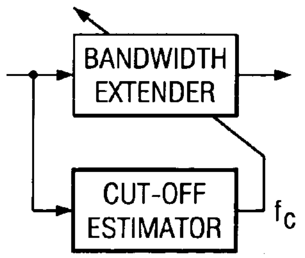
FIG. 2d (PRIOR ART)

Before being added to x(n), the level of $u_2(n)$ is adjusted using gain G(n), so that the band-expanded spectrum exhibits a smooth transition from the original spectrum through the synthesized high frequency spectrum (see the lower right panel in FIG. 2*c*). Obviously G(n) must depend on the shape of the input spectrum.

In FIG. 2*b*, preferred embodiment methods determine G(n) from the input signal x(n) using two high-pass filters, $HP_H(z)$ and $HP_M(z)$, which yield $v_H(n)$ and $v_M(n)$, respectively. Take the cut-off frequencies of the filters $HP_H(z)$ and $HP_M(z)$ to be $F_H=F_C-\alpha f_m$ and $F_M=F_C-f_m$, respectively, where $\alpha$ ($0<\alpha<1$) is a constant. As an example, with $F_S$=44.1 kHz and $F_C$=16 kHz, parameter values could be $f_m$=4 kHz and $\alpha$=0.5. In this case, the cut-off frequencies for $HP_H$ and $HP_M$ would be $F_H$=14 kHz and $F_M$=12 kHz, respectively; and $v_H(n)$ would be the portion of x(n) with frequencies in the interval $F_C-\alpha f_m<f<F_C$ (14-16 kHz) and $v_M(n)$ the portion of x(n) with frequencies in the larger interval $F_C-f_m<f<F_C$ (12-16 kHz).

Then G(n) is determined by $$G(n)=2\Sigma_i|v_H(n-i)|/\alpha\Sigma_i|v_M(n-i)|$$

where $\alpha$ factor compensates for the different frequency ranges in $v_H(n)$ and $v_M(n)$, and the factor of 2 is for canceling the ½ in the definition of $U_1(f)$. Finally, we obtain the band-expanded output:

$$y(n)=x(n)+G(n)u_2(n)$$

From its definition, G(n) can be seen to be a rough estimation of the energy transition of |X(f)| for f in the interval $F_C-f_m<f<F_C$. This is because the definition of G(n) can be interpreted using Parseval's theorem as $$G(n) = 2\int_{-\infty<f<\infty}|HP_H(f)X(f)|\,df \Big/ \alpha\int_{-\infty<f<\infty}|HP_M(f)X(f)|\,df$$

$$\approx 2\int_{Fc-\alpha fm<f<Fc}|X(f)|\,df \Big/ \alpha\int_{Fc-f_m<f<Fc}|X(f)|\,df$$

Note that this is just for ease of understanding and is mathematically incorrect because Parseval's theorem applies in $L^2$ and not in $L^1$. For example, if the numerator integral gives a small value, it is likely that X(f) decreases as f increases in the interval $F_C-f_m<f<F_C$. Thus the definition tries to let G(n) be smaller so that the synthesized high frequency components get suppressed in the bandwidth expansion interval $F_C<f<F_C+f_m$.

3. BWE for Stereo

Figure 1A:
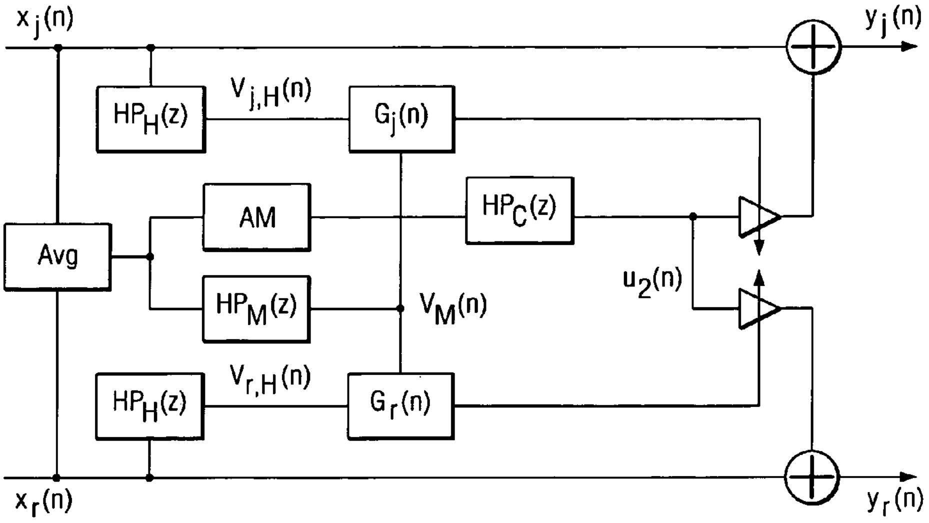
FIGS. 1*a*-1*m* show spectra and functional blocks of bandwidth extension to either high or low frequencies of preferred embodiments.

FIG. 1*a* illustrates a first preferred embodiment system. In preferred embodiment methods the input stereo signals $x_l(n)$ and $x_r(n)$ are averaged and this average signal processed for high frequency component synthesis. Thus, first modulate:

$$u_1(n)=\cos[2\pi f_m n/F_S](x_l(n)+x_r(n))/2$$

Next, by high-pass filtering $u_1(n)$ with $HP_C(z)$, we obtain $u_2(n)$, the high frequency components. The signal $u_2(n)$ can be understood as a center channel signal for IS. We then apply the gains $G_l(n)$ and $G_r(n)$ to adjust the level of $u_2(n)$ for left and right channels, respectively. Ideally, we separately compute $G_l(n)$ and $G_r(n)$ for the left and right channels, but the preferred embodiment methods provide further computation reduction and apply $HP_M(z)$ only to the center channel while having $HP_H(z)$ applied individually to left and right channels. That is, left channel input signal $x_l(n)$ is filtered using high-pass filter $HP_H(z)$ to yield $v_{l,H}(n)$ and right channel input signal $x_r(n)$ is filtered again using high-pass filter $HP_H(z)$ to yield $v_{r,H}(n)$; next, the center channel signal $(x_l(n)+x_r(n))/2$ is filtered using high-pass filter $HP_M(z)$ to yield $v_M(n)$. Then define the gains for the left and right channels:

$$G_l(n)=2\Sigma_i|v_{l,H}(n-i)|/\alpha\Sigma_i|v_M(n-i)|$$

$$G_r(n)=2\Sigma_i|v_{r,H}(n-i)|/\alpha\Sigma_i|v_M(n-i)|$$

Lastly, compute the left and right channel bandwidth-expanded outputs using the separate left and right channel gains with the $HP_C$-filtered, modulated center channel signal $u_2(n)$:

$$y_l(n)=x_l(n)+G_l(n)u_2(n)$$

$$y_r(n)=x_r(n)+G_r(n)u_2(n)$$

The determination of $F_C$ can be adaptive as described in the following section, and this provides a method to determine $f_m$, such as taking $f_m$=20 kHz$-F_C$.

4. Cut-Off Frequency Estimation

Preferred embodiment methods estimate the cut-off frequency $F_C$ of the input signal from the input signal, and then the modulation amount $f_m$ and the cut-off frequency of the high-pass filter can be determined in run-time depending on the input signal. That is, the bandwidth expansion can adapt to the input signal bandwidth.

Figure 1B:
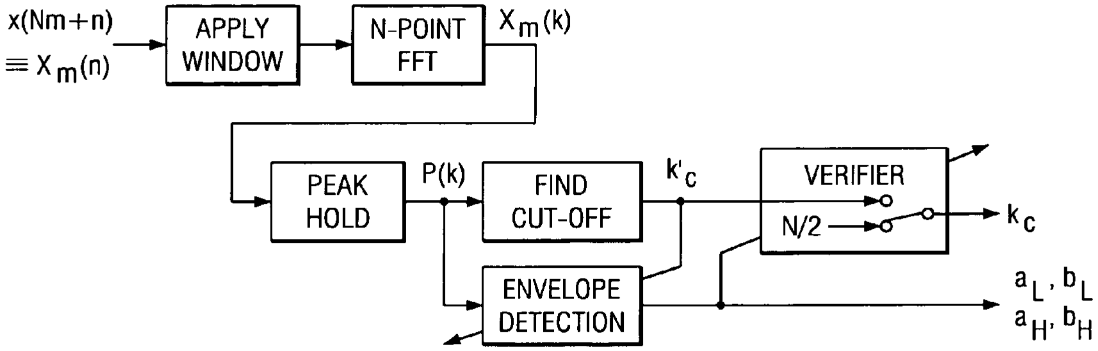

FIG. 1*b* shows the block diagram of the preferred embodiment cut-off estimator. It receives input samples x(n) as successive frames of length N, and outputs the estimated cut-off frequency index $k_c$ with auxiliary characteristics of the detected envelope for each frame. The corresponding cut-off frequency is then given by $$F_C=F_S k_c/N$$

Figure 1C:
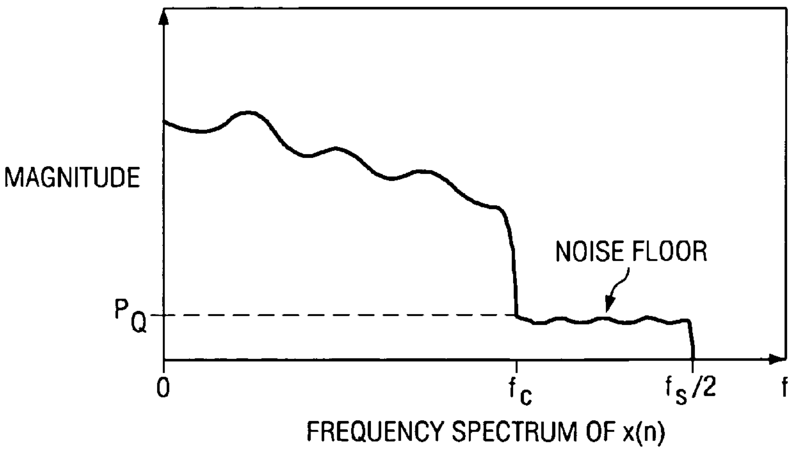

The input sequence x(n) is assumed to be M-bit linear pulse code modulation (PCM), which is a very general and reasonable assumption in digital audio applications. The frequency spectrum of x(n) accordingly has the so-called noise floor originating from quantization error as shown in FIG. 1*c*. First, derive the magnitude of the noise floor, which underlies the preferred embodiment methods.

Suppose that x(n) was obtained through quantization of the original signal u(n) in which q(n)=x(n)−u(n) is the quantization error, and the quantization step size is $$\Delta=2^{-M+1}$$

According to the classical quantization model, the quantization error variance is given by $$E[q^2]=\Delta^2/12\equiv P_q$$

On the other hand, the quantization error can generally be considered as white noise. Let Q(k) be the N-point discrete Fourier transform (DFT) of q(n) defined by $$Q(k)=1/N\Sigma_{0\leqq n\leqq N-1}q(n)e^{-j2\pi nk/N}$$

Then, the expectation of the power spectrum will be constant as $$E[|Q(k)|^2]=P_Q$$

The constant $P_Q$ gives the noise floor as shown in FIG. 1*c*.

From Parseval's theorem, the following relation holds:

$$\Sigma_{0\leqq k\leqq N-1}|Q(k)|^2=1/N\Sigma_{0\leqq n\leqq N-1}q(n)^2$$

By taking the expectation of this relation and using the foregoing, the noise floor is given by $$P_Q=P_q/N=1/(3\,2^{2M}N)$$

As shown in block diagram FIG. 1*b* the frequency spectrum of input frames is computed by an N-point FFT after the input samples are multiplied with a window function to suppress side-lobes. The peak hold technique can optionally be applied to the power spectrum along with time in order to smooth the power spectrum. It will lead to moderate time variation of the candidate cut-off frequency $k_c'$.

Let $x_m(n)$ be the input samples of the m-th frame as $$x_m(n)=x(Nm+n)\ 0\leqq n\leqq N-1$$

Then, the frequency spectrum of the windowed m-th frame becomes $$X_m(k)=1/N\Sigma_{0\leqq n\leqq N-1}w(n)x_m(n)e^{-j2\pi nk/N}$$

where w(n) is the window function such as a Hann, Hamming, Blackman, et cetera, window.

Define the peak power spectrum of the m-th frame, $P_m(k)$ for $0\leqq k\leqq N/2$, as $$P_m(k)=\max\{\alpha P_{m-1}(k), |X_m(k)|^2+|X_m(-k)|^2\}$$

where α is the decay rate of peak power per frame. Note that the periodicity $X_m(k)=X_m(N+k)$ holds in the above definition. For simplicity, we will omit the subscript m in the peak power spectrum for the current frame in the following.

After the peak power spectrum is obtained, the candidate cut-off frequency $k_c'$ is identified as the highest frequency bin for which the peak power exceeds a threshold T:

$$P(k_c')>T$$

The threshold T is adapted to both the signal level and the noise floor. The signal level is measured in mean peak power within the range $[K_1, K_2]$ defined as $$P_X=\Sigma_{K_1\leqq k\leqq K_2}P(k)/(K_2-K_1+1)$$

The range is chosen such that $P_X$ reflects the signal level in higher frequencies including possible cut-off frequencies.

For example, $[K_1, K_2]=[N/5, N/2]$. The threshold T is then determined as the geometric mean of the mean peak power $P_X$ and the noise floor $P_Q$:

$$T=\sqrt{(P_X P_Q)}$$

In the decibel domain, this is equivalent to placing T at the midpoint between $P_X$ and $P_Q$ as $$\mathcal{T}=(\mathcal{P}_X+\mathcal{P}_Q)/2$$

where the calligraphic letters represent the decibel value of the corresponding power variable as $$\mathcal{P}=10\log_{10}P$$

Figure 1D:
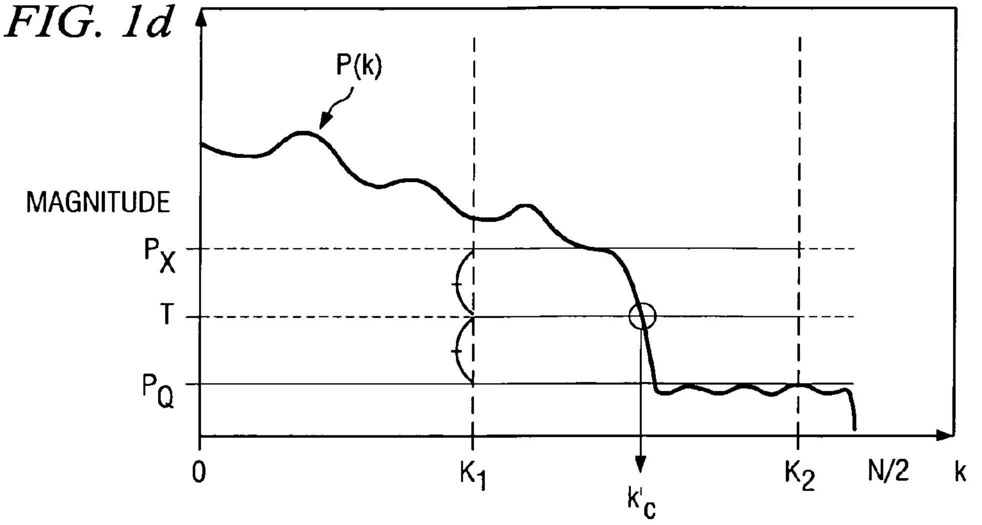

FIG. 1*d* presents an illustrative explanation of the adaptive thresholding. From the expression "mean peak power", one might think that $P_X$ should be located lower than depicted in the figure as the mean magnitude of P(k) for $[K_1, K_2]$ will be slightly above T in the figure. However, $P_X$ is not the mean magnitude, i.e., the mean in the decibel domain, but the physical mean power as defined by the sum over $[K_1, K_2]$. As a result, the threshold T will be placed between the signal level and the noise floor so that it will be adapted suitably to the signal level.

It must be noted that, even if there is no actual cut-off in P(k), the above method will identify a certain $k_c'$ as the candidate cut-off, which is actually a false cut-off frequency. Hence, whether there is the true cut-off at the candidate $k_c'$ or not should be examined.

Figure 1E:
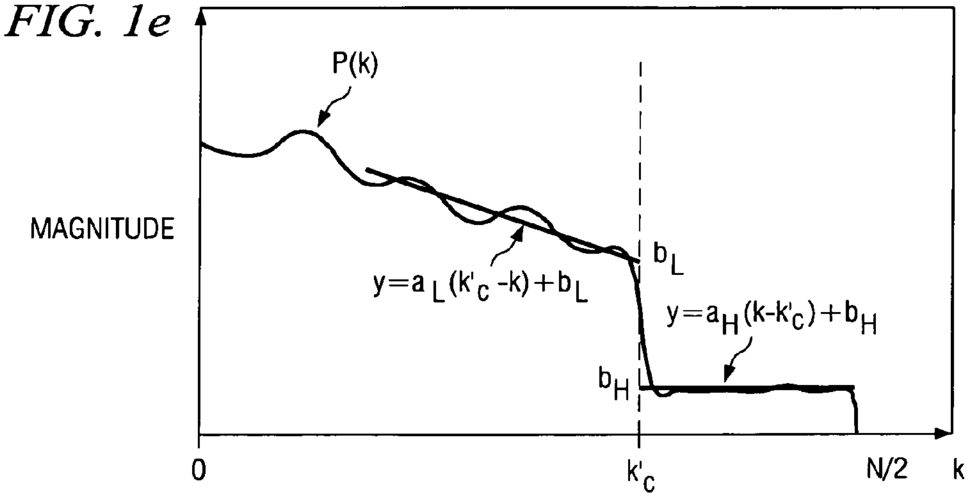

In order to see if there is the actual cut-off at $k_c'$, the preferred embodiment method detects the envelope of P(k) separately for below $k_c'$ and for above $k_c'$. It uses linear approximation of the peak power spectrum in the decibel domain, as shown in FIG. 1*e*. The spectrum below $k_c'$ and that above $k_c'$ are approximated respectively by $$y=a_L(k_c'-k)+b_L$$

and $$y=a_H(k-k_c')+b_H$$

Figure 1F:
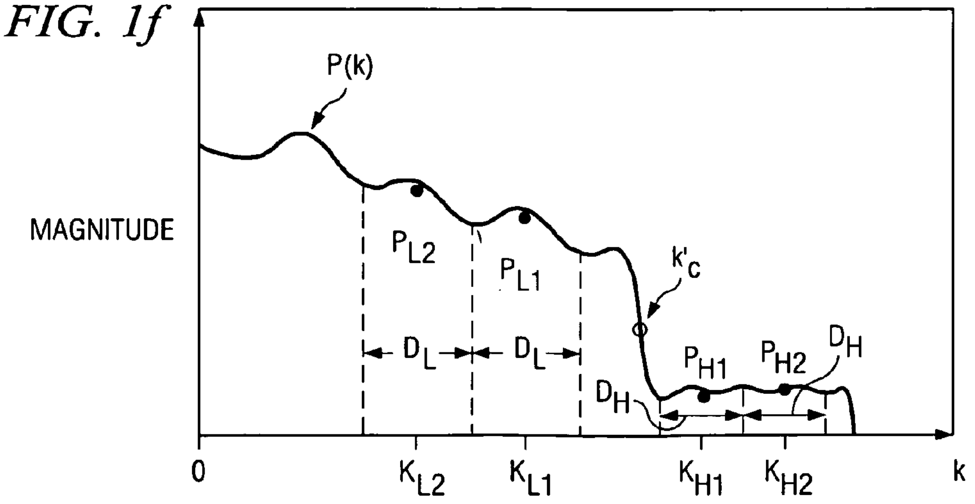

The slopes $a_L$, $a_H$ and the offsets $b_L$, $b_H$ are derived by the simple two-point linear-interpolation. To obtain $a_L$ and $b_L$, two reference points $K_{L1}$ and $K_{L2}$ are set as in FIG. 1*f*. For example, $$K_{L1}=k_c'-N/16,\ K_{L2}=k_c'-3N/16$$

Then, the mean peak power is calculated for the two adjacent regions centered at the two reference points as $$P_{L1}=(1/D_L)\Sigma_{K_{L1}-D_L/2\leqq k\leqq K_{L1}+D_L/2-1}P(k)$$

$$P_{L2}=(1/D_L)\Sigma_{K_{L2}-D_L/2\leqq k\leqq L_{L2}+D_L/2-1}P(k)$$

where $D_L$ is the width of the regions:

$$D_L=K_{L1}-K_{L2}$$

The linear-interpolation of the two representative points, $(K_{L1}, P_{L1})$ and $(K_{L2}, P_{L2})$, in the decibel domain gives $$a_L=(\mathcal{P}_{L2}-\mathcal{P}_{L1})/D_L$$

$$b_L=(K_{L2}\mathcal{P}_{L1}-K_{L1}\mathcal{P}_{L2})/D_L$$

where $\mathcal{P}_{L1}$, $\mathcal{P}_{L2}$ are again decibel values of $P_{L1}$, $P_{L2}$.

Similarly, for the envelope above $k_c'$, $K_{H1}$ and $K_{H2}$ are set appropriately, and $$P_{H1}=(1/D_H)\Sigma_{K_{H1}-D_H/2\leqq k\leqq K_{H1}+D_H/2-1}P(k)$$

$$P_{H2}=(1/D_H)\Sigma_{K_{H2}-D_H/2\leqq k\leqq K_{H2}+D_H/2-1}P(k)$$

are computed, where $$D_H=K_{H2}-K_{H1}$$

Example values are $$K_{H1}=k_c'+N/16,\ K_{H2}=k_c'+N/8$$

With these values $a_H$ and $b_H$ can be computed by just switching L to H in the foregoing.

In the preferred embodiment method, the candidate cut-off frequency $k_c'$ is verified as $$k_c = \begin{cases} k_c' & \text{if } (b_L-b_H)>\mathcal{T}_b \\ N/2 & \text{otherwise} \end{cases}$$

where $k_c$ is the final estimation of the cut-off frequency, and $\mathcal{T}_b$ is a threshold. The condition indicates that there should be a drop-off larger than $\mathcal{T}_b$ (dB) at $k_c'$ so that the candidate can be considered as the true cut-off frequency.

There are many other possible ways to verify the candidate cut-off frequency $k_c'$ using $a_L$, $b_L$, $a_H$ and $b_H$. Another simple example is $$b_L>\mathcal{T}>b_H$$

This condition means that the offsets should be on the expected side of the threshold. Even more sophisticated and robust criteria may be considered using the slopes $a_L$ and $a_H$.

5. BWE in Time Domain

Figure 1G:
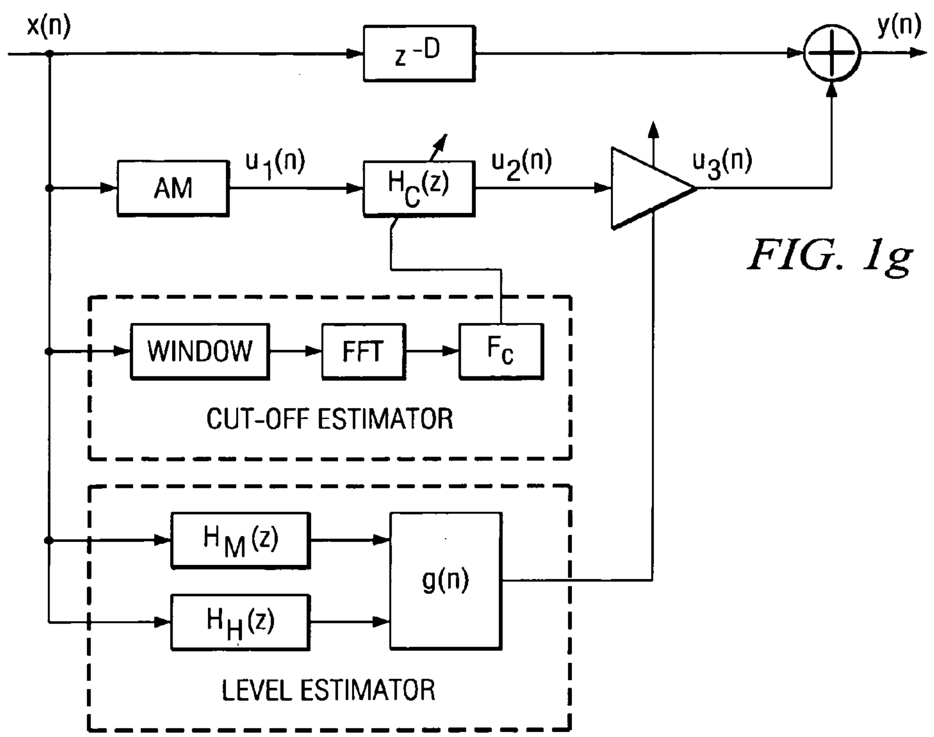

FIG. 1*g* shows the block diagram of a preferred embodiment time domain BWE implementation. The system is similar to the preferred embodiment of sections 2 and 3 but with a cut-off frequency (bandwidth) estimator and input delay $z^{-D}$. Suppose that the input signal x(n) has been sampled with sampling frequency at $F_S$ and low-pass filtered with cut-off frequency at $F_C$. The input signal x(n) is processed with AM to produce signal $u_1(n)$, which can be said to be a frequency-shifted signal. High-pass filter $H_C(z)$ is applied to $u_1(n)$ in order to preserve the input signal under the cut-off frequency $F_C$ when $u_1(n)$ is mixed with x(n). Therefore the cut-off frequency of $H_C(z)$ has to be set at $F_C$. If $F_C$ is unknown a priori or varies with time, the cut-off estimator of the preceding section can be used in run-time to estimate $F_C$ and determine the filter coefficients of $H_C(z)$. The output from $H_C(z)$, $u_2(n)$, is amplified or attenuated with time-varying gain g(n) before being mixed with x(n). As described in foregoing sections 2-3, the gain g(n) is determined in run-time by the level estimator so that the spectrum of the output signal y(n) shows a smooth transition around $F_C$. The input delay $z^{-D}$ is used to compensate for the phase delay caused by $H_C(z)$. For example, when $H_C(z)$ is designed as a linear phase FIR and its order is 2L, the delay amount is D=L.

The high-pass filter coefficients $H_C(z)$ is determined every time $k_c$ (or $F_C(n)$) is updated. From the implementation view point, the filter coefficient creation has to be done with low computation complexity. The known approach precalculates and stores in a ROM a variety of IIR (or FIR) filter coefficients that correspond to the possible cut-off frequencies. If an IIR filter is used, $H_C(z)$ will have non-linear phase response and the output $u_2(n)$ will not be phase-aligned with the input signal x(n) even if we have the delay unit. This could cause perceptual distortion. On the other hand, FIR filters generally require longer tap length than IIR filters. Therefore huge amount of ROM size will be required to store FIR filter coefficients for variety of cut-off frequencies. To avoid these problems, the preferred embodiment design form $H_C(z)$ with FIR that requires small amount of ROM size and low computational cost. With this design, the preferred embodiment system enables better sound quality than the known approach with IIR implementation for $H_C(z)$ or much smaller ROM size than that with FIR implementation.

Our FIR filter design method is similar to that presented in cross-reference patent application No. 60/660,372, which is based on the well-known windowed sinc function. The impulse response $h_{id}^{(n)}(m)$ of the "ideal" high-pass filter with cut-off angular frequency at $\omega_C(n)$ at time n can be found by inverse Fourier transforming the ideal frequency-domain high-pass filter as follows:

$$h_{id}^{(n)}(m)=(1/2\pi)\{\int_{-\pi\leqq\omega\leqq-\omega C(n)}e^{-j2\pi\omega}d\omega+\int_{\pi\leqq\omega\leqq\omega C(n)}e^{-j2\pi\omega}d\omega\}$$

so $$\begin{aligned} h_{id}^{(n)}(m) &= 1-\omega_C(n)/\pi && \text{for } m=0 \\ &= -\sin[\omega_C(n)m]/\pi\, m && \text{for } m=\pm1,\pm2,\pm3,\ldots \end{aligned}$$

Substituting $\omega_C(n)=2\pi F_C(n)/F_S$ gives $$\begin{aligned} h_{id}^{(n)}(m) &= 1-k_c(n)/(N/2) && \text{for } m=0 \\ &= -\sin[2\pi\, k_c(n)m/N]/\pi\, m && \text{for } m=\pm1,\pm2,\pm3,\ldots \end{aligned}$$

This "ideal" filter requires the infinite length for $h_{id}^{(n)}(m)$. In order to truncate the length to a finite number, window function is often used that reduces the Gibbs phenomenon. Let the window function be denoted w(m) and non-zero only in the range $-L\leqq m\leqq L$, then practical FIR high-pass filter coefficients with order-2L can be given as $$\begin{aligned} h^{(n)}(m) &= (1-k_c(n)/(N/2))w(0) && \text{for } m=0 \\ &= -w(m)\sin[2\pi\, k_c(n)m/N]/\pi\, m && \text{for } m=\pm1,\pm2,\pm3,\ldots \end{aligned}$$

For run-time calculation of these filter coefficients, we factor $h^{(n)}(m)$ as $$h^{(n)}(m)=h_w(m)h_S^{(n)}(m)$$

where $$\begin{aligned} h_w(m) &= 1 && \text{for } m=0 \\ &= w(m)/\pi\, m && \text{for } m=\pm1,\pm2,\pm3,\ldots \end{aligned}$$

and $$\begin{aligned} h_S^{(n)}(m) &= h_0^{(n)} && \text{for } m=0 \\ &= -\sin[2\pi\, k_c(n)m/N] && \text{for } m=\pm1,\pm2,\pm3,\ldots \end{aligned}$$

with $h_0^{(n)}=(1-k_c(n)/(N/2))w(0)$.

It is clear that $h_w(m)$ is independent of the cut-off frequency and therefore time-invariant. It can be precalculated and stored in a ROM and then referenced for generating filter coefficients in run-time with any cut-off frequencies. The term $h_S^{(n)}(m)$ can be calculated with low computation using a recursive method as in the cross-referenced application. In particular, presume that $$s_1(n)=\sin[2\pi k_c(n)/N]$$

$$c_1(n)=\cos[2\pi k_c(n)/N]$$

can be obtained by referring to a look-up table, then we can perform recursions for positive m:

$$h_S^{(n)}(1)=s_1(n)$$

$$h_S^{(n)}(2)=2c_1(n)h_S^{(n)}(1)$$

$$h_S^{(n)}(3)=2c_1(n)h_S^{(n)}(2)-h_S^{(n)}(1)$$

$$\ldots$$

$$h_S^{(n)}(m)=2c_1(n)h_S^{(n)}(m-1)-h_S^{(n)}(m-2)$$

and for negative m use $h_S^{(n)}(m)=-h_S^{(n)}(-m)$.

The FIR filter derived above doesn't satisfy causality; that is, there exists m such that $h^{(n)}(m)\neq0$ for $-L\leqq m<0$, whereas causality has to be satisfied for practical FIR implementations. To cope with this problem, we insert a delay in the FIR filtering in order to make it causal. That is, $$u_2(n)=\Sigma_{-L\leqq m\leqq L}u_1(n-m-L)h^{(n)}(m)$$

where $u_2(n)$ is the output signal (see FIG. 1*g*).

6. BWE in Frequency Domain

FIR filtering is a convolution with the impulse response function; and convolution transforms into pointwise multiplication in the frequency domain. Consequently, a popular alternative formulation of FIR filtering includes first transform (e.g., FFT) a block of the input signal and the impulse response to the frequency domain, next multiply the transforms, and lastly, inverse transform (e.g, IFFT) the product back to the time domain.

Figure 1H:
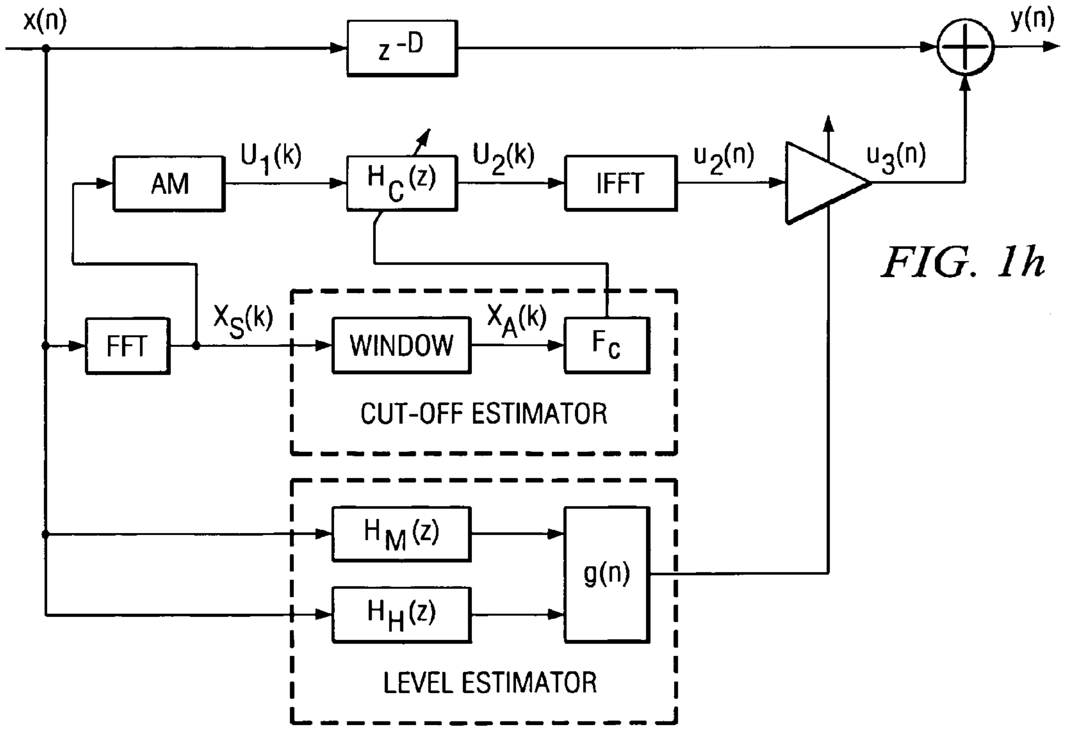
Figure 2E:
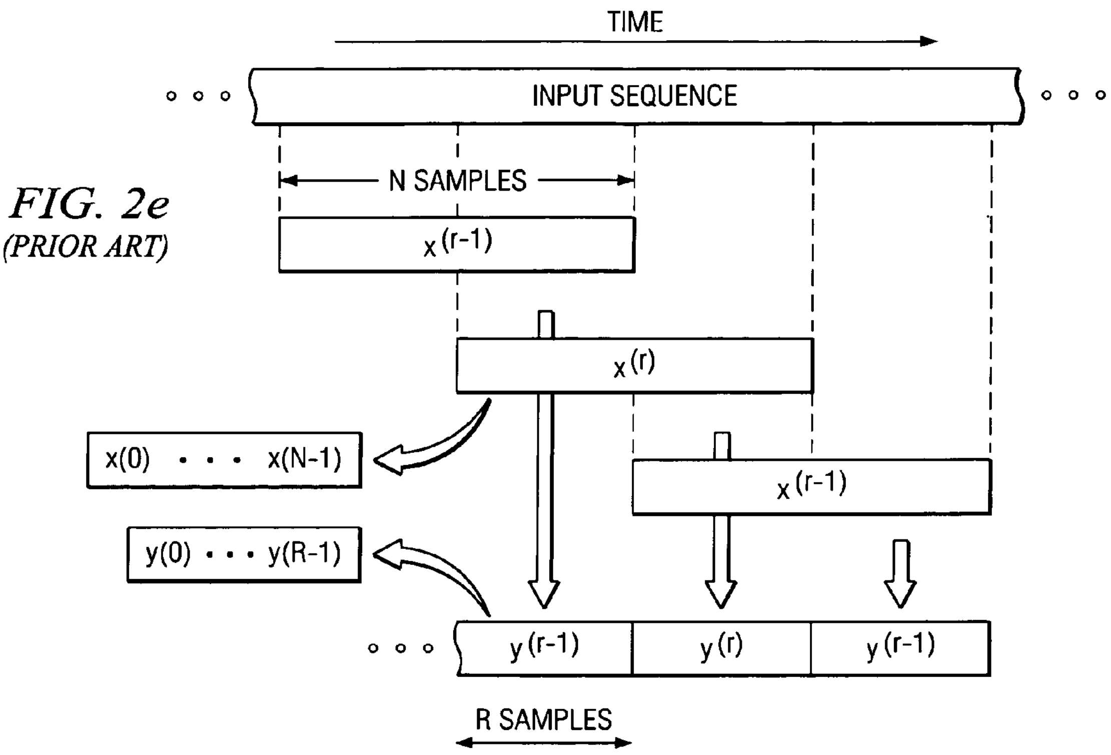
FIG. 2e (PRIOR ART)

FIG. 1*h* shows the block diagram of the preferred embodiment frequency domain BWE implementation. For the overlap-save method, an overlapped frame of input signal is processed to generate a non-overlapped frame of output signal. See FIG. 2*e* illustrating overlap-save generally, where $x^{(r)}$ denotes the N-vector of samples constituting the r-th frame (r=1, 2, . . . ) of input signal and defined as $$x^{(r)}(m)=x(Rr+m-N)\quad 0\leqq m\leqq N-1$$

We assume x(m)=0 for m<0. Note that, for the FFT processing, N is chosen to be a power of 2, such as 256. FIG. 2*e* indicates that N−R samples in the frame are overlapped with the previous frames. By processing N-vector $x^{(r)}$ of input samples, we will obtain a non-overlapped R-vector of output signal $y^{(r)}$ defined as $$y^{(r)}(m)=y(Rr+m-R)\quad 0\leqq m\leqq R-1$$

In FIG. 1*h* the cut-off estimation and the high frequency synthesis are done in frequency domain, while the other functions are implemented in time domain.

Due to the frame-based processing, the cut-off frequency estimation can be done each frame, not for each input sample. Hence update of the high-pass filter becomes to be done less frequently. However, as is often the case, this causes no quality degradation because the input signal can be assumed to be stationary during a certain amount of duration, and the cut-off frequency is expected to change slowly.

For the r-th frame, the DFT (FFT implementation) of $x^{(r)}$ is defined as:

$$X_S^{(r)}(k)=\Sigma_{0\leqq m\leqq N-1}x^{(r)}(m)\exp[-j2\pi km/N]$$

The DFT coefficients $X_S^{(r)}(k)$ will be used for high-frequency synthesis, and also the cut-off estimation after a simple conversion as explained in detail in the following.

The AM operation is applied to $x^{(r)}(m)$ as described in section 2 above:

$$u_1^{(r)}(m)=\cos[2\pi F_m m/F_S]x^{(r)}(m)$$

Note that, in the following discussion regarding frequency domain conversion, a constraint will have to be fulfilled on the frequency-shift amount $F_m$. Let $k_m$ be a bin number of frequency-shift amount, we have to satisfy $k_m=NF_m/F_S$ is an integer since the bin number has to be integer. On the other hand, for use of FFT, the frame size N has to be power of 2. Hence, $F_m=F_S/2^{integer}$.

Also note that, the use of overlapped frames requires another condition to be satisfied on the output frame size R. The cosine weight in the modulation for overlapped input signals in successive frames has to be the same values. Otherwise the same input signal in different frames is weighted by different cosine weights, which causes perceptual distortion around output frame boundaries. Since $$x^{(r)}(m)=x(Rr+n-N)=x^{(r-1)}(m+R),$$

we have to satisfy $$\cos[2\pi F_m m/F_S]=\cos[2\pi F_m(m+R)/F_S]$$

This leads to $$F_m=F_S I/R$$

where I is an integer value. This leads to R being 4 times an integer. This condition is not so strict for most of the applications. Overlap ratio of 50% (e.g, R=N/2) is often chosen for frequency domain processing, which satisfies R being 4 times an integer.

Then we convert the operation modulation to the frequency domain. Again with capitals denoting transforms of lower case:

$$U_1^{(r)}(k)=\tfrac{1}{2}(X_S^{(r)}(k-k_m)+X_S^{(r)}(k+k_m))$$

The equation indicates that, once we have obtained the DFT of the input frame, then the AM processing can be performed in frequency domain just by summing two DFT bin values.

Now apply the overlap-save method to implement the time domain FIR convolution at the end of section 5. Let the r-th frame of the output from the high-pass filter be $u_2^{(r)}(m)$ for $0\leqq m\leqq R-1$. The sequence can be calculated using the overlap-save method as follows. First, let $h^{(r)}(m)$ be the filter coefficients, which are obtained similarly to $h^{(n)}(m)$ as described in section 5 above but for the r-th frame instead of time n. The length-(2L+1) sequence $h^{(r)}(m)$ is extended to a periodic sequence with period N by padding with N−2L−1 0s. Note that we need $2L\leqq N-R$ to keep the convolution in a single block. Here we set 2L=N−R. After these, we can calculate FFT of $h^{(r)}(m)$ and denote this $H^{(r)}(k)$.

Now let $V^{(r)}(k)=H^{(r)}(k)\,U_1^{(r)}(k)$ for $0\leqq k\leqq N-1$. Then, let $v^{(r)}(m)$ denote the inverse FFT of $V^{(r)}(k)$; extract $u_2^{(r)}(m)$ from $v^{(r)}(m)$:

$$u_2^{(r)}(m)=v^{(r)}(m+L)\text{ for }0\leqq m\leqq R-1$$

By unframing the output frame $u_2^{(r)}(m)$ (see FIG. 2*e*), the output signal $u_2(m)$ is obtained as synthesized high frequency components.

Here we explain our method to calculate the DFT of the filter coefficients, $H^{(r)}(k)$, which is required for the overlap-save method. Recall the formula of the filter coefficients for r-th frame, and after extending this to a periodic sequence with period N using zero padding, then we have $$h^{(r)}(m)=h_w(m)h_S^{(r)}(m)\text{ for }m=0,\pm1,\pm2,\ldots,\pm N/2$$

where $$\begin{aligned} h_w(m) &= 1 && \text{for } m=0\\ &= w(m)/\pi m && \text{for } m=\pm1,\pm2,\ldots,\pm L\\ &= 0 && \text{for } m=\pm(L+1),\pm(L+2),\ldots,\pm N/2 \end{aligned}$$

and $$\begin{aligned} h_S^{(r)}(m) &= h_0^{(r)} && \text{for } m=0\\ &= -\sin[2\pi\, k_c(r)m/N] && \text{for } m=\pm1,\pm2,\ldots,\pm N/2 \end{aligned}$$

with $h_0^{(r)}=(1-k_c(r)/(N/2))\,w(0)$. Note we assume here that the cut-off frequency index for r-th frame, $k_c(r)$, has already been obtained. Also note that $h_S^{(r)}(m)$ doesn't have to be zero-padded, because $h_w(m)$ is zero-padded and that makes $h^{(r)}(m)$ zero-padded.

It is well known that the time domain point-wise multiplication is equivalent to circular convolution of the DFT coefficients. Let $H_w(k)$ and $H_S^{(r)}(k)$, respectively, be the DFT of $h_w(m)$ and $h_S^{(r)}(m)$, then the product $h^{(r)}(m)=h_w(m)\,h_S^{(r)}(m)$ transforms to $$\begin{aligned} H^{(r)}(k) &= H_w(k)\otimes H_S^{(r)}(k)\\ &= 1/N\sum_{0\leq i\leq N-1} H_w(k-i)H_S^{(r)}(i) \end{aligned}$$

where $\otimes$ denotes the circular convolution and we assumed the periodicity on the DFT coefficients. Note that $h_w(m)$ is the sum of $\delta(m)$ plus an odd function of m, thus $H_w(k)=1+jH_{w,Im}(k)$ where $H_{w,Im}(k)$ is a real sequence; namely, the discrete sine transform of $h_w(m)$. Since $H_{w,Im}(k)$ is independent of the cut-off frequency, it can be precalculated and stored in a ROM. As for $H_S^{(r)}(k)$, because $h_S^{(r)}(m)$ is just the sine function, we can write $$H_S^{(r)}(k)=h_0^{(r)}+j(N/2)[\delta(k-k_C(r))-\delta(k+k_C(r))]$$

Thus the circular convolution can be simplified significantly. Since the DFT coefficients of real sequences are asymmetric in their imaginary parts about k=0, the following relations hold:

$$\begin{aligned} jH_{w,Im}(k)\otimes h_0^{(r)} &= jh_0^{(r)}/N\sum_{0\leq i\leq N-1} H_{w,Im}(k-i)\\ &= 0 \end{aligned}$$

and similarly, $$1\otimes j(N/2)[\delta(k-k_C(r))-\delta(k+k_C(r))]=0$$

Consequently, $$H^{(r)}(k)=h_0^{(r)}+\tfrac{1}{2}[H_{w,Im}(k+k_C(r))-H_{w,Im}(k-k_C(r))]$$

Thus $H^{(r)}(k)$ can be easily obtained by just adding look-up table values $H_{w,Im}(k)$.

The order of the high-pass filter, which has been set at 2L=N−R in the preferred embodiment method, can be further examined. In general, we hope to design a long filter that has better cut-off characteristic. However, due to the behavior of circular convolution of the overlap-save method, illegally long order of filter results in time domain alias. See FIG. 2*e*, where we extract R output samples out of N samples. This is because the other samples are distorted by leak from the circular convolution, hence they are meaningless samples.

Preceding section 4 provided the method that estimates frame-varying cut-off frequency $k_C(r)$ in the system FIG. 1*h*. This requires windowed FFT coefficients as input, which can be rewritten as $$X_A^{(r)}(k)=1/N\Sigma_{0\leqq m\leqq N-1}w_a(m)x^{(r)}(m)\exp[-j2\pi mk/N]$$

In general, the analysis window function $w_a(m)$ has to be used to suppress the sidelobes caused by the frame boundary discontinuity. However, direct implementation of FFT only for this purpose requires redundant computation, since we need another FFT that is used for $X_S^{(r)}(k)$. To cope with this problem, we propose an efficient method that calculates $X_A^{(r)}(k)$ from $X_S^{(r)}(k)$, which enables economy of computational cost. Based on our method, any kind of window function can be used for $w_a(m)$, as long as it is derived from a summation of cosine sequences. This includes Hann, Hamming, Blackman, Blackman-Harris windows which are commonly expressed as the following formula:

$$w_a(m)=\Sigma_{0\leqq i\leqq M}a_m\cos[2\pi mi/N]$$

For example, for the Hann window, M=1, $a_0$=½ and $a_1$=½.

Comparison of $X_A^{(r)}(k)$ and $X_S^{(r)}(k)$ as DFTs leads to the following relation:

$$X_A^{(r)}(k)=X_A^{(r)}(k)\otimes W_a(k)$$

where $W_a(k)$ is the DFT of $w_a(m)$. Using the expression of $w_a(m)$ in terms of cosines and after simplification, we obtain $$X_A^{(r)}(k)=a_0X_S^{(r)}(k)+\tfrac{1}{2}\Sigma_{1\leqq m\leqq M}a_m(X_S^{(r)}(k-m)+X_S^{(r)}(k+m))$$

Typically, M=1 for Hann and Hamming windows, M=2 for Blackman window and M=3 for Blackman-Harris window. Therefore the computational load of this relation is much lower than additional FFT that would be implemented just to obtain $X_A^{(r)}(k)$.

Since the preferred embodiment frequency domain method for BWE is much more complicated than that the time domain method, we summarize the steps of the procedure.

(1) Receive R input samples and associate an N-sample frame overlapped with the previous ones. The overlap length N−R has to be N−R=2L, where 2L is the order of high-pass filter $H_C(z)$.

(2) The N sample input signal is processed with FFT to obtain $X_S^{(r)}(k)$.

(3) $X_S^{(r)}(k)$ is converted to $X_A^{(r)}(k)$, which is the short-time spectrum of the input signal with a cosine-derived window.

(4) Using $X_A^{(r)}(k)$, the cut-off frequency index $k_C(r)$ is estimated. The estimation can be done based on either approach in section 4.

(5) $X_S^{(r)}(k)$ is also frequency-shifted by cosine modulation to yield $U_1^{(r)}(k)$ (6) $U_1^{(r)}(k)$ is point-wisely multiplied with $H^{(r)}(k)$ to yield $U_2^{(r)}(r,k)$, where $H^{(r)}(k)$ is calculated as $h_0^{(r)}+\tfrac{1}{2}[H_{w,lm}(k+k_C(r))-H_{w,lm}(k-k_C(r))]$ using a lookup table for the $H_{w,lm}(.)$ values.

(7) $U_2^{(r)}(r,k)$ is processed with IFFT to get $u_2^{(r)}(r,m)$, and the synthesized high frequency components $u_2(n)$ is extracted as $u_2^{(r)}(r,n+L)$ (8) The gain g(n) is determined as in section 3, and applied to the high frequency components $u_2(n)$.

(9) The signal $u_2(n)$ is added to delayed input signal, where the delay amount D is given by D=L.

7. Bass Expansion

Figure 1I:
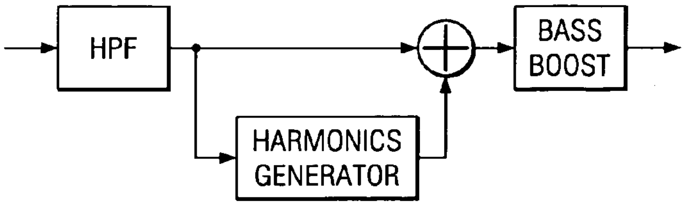
Figure 2F:
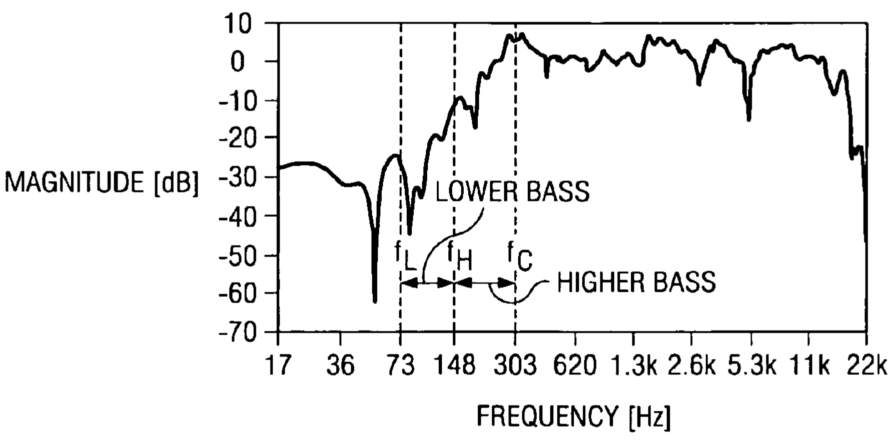
FIG. 2f (PRIOR ART)

FIG. 1*i* shows the block diagram of the preferred embodiment bass enhancement system, which is composed of a high-pass filter ‘HPF’, the preferred embodiment harmonics generator, and a bass boost filter ‘Bass Boost’. The high-pass filter removes frequencies under $f_L$ (see FIG. 2*f*) that are irreproducible with the loudspeaker of interest and are out of scope of the bass enhancement in the present invention. Those frequencies are attenuated in advance not to disturb the proposed harmonics generation and to eliminate the irreproducible energy in the output signal.

The bass boost filter is intended to equalize the loudspeaker of interest for the higher bass frequencies $f_H\leqq f\leqq f_C$.

Figure 1J:
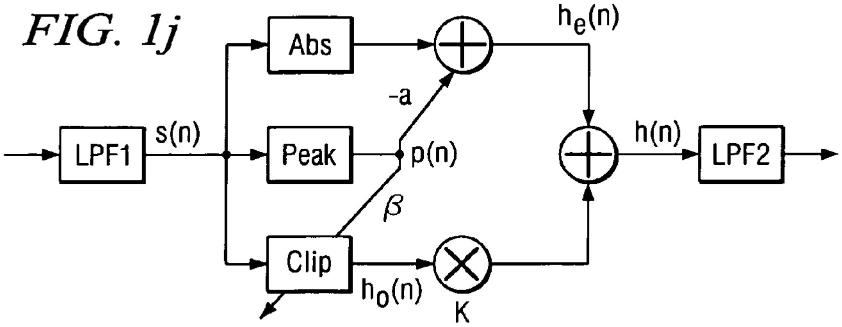

The preferred embodiment harmonics generator generates integral-order harmonics of the lower bass frequencies $f_L\leqq f\leqq f_H$ with an effective combination of a full wave rectifier and a clipper. FIG. 1*j* illustrates the block diagram, where n is the discrete time index. The signal s(n) is the output of the input low-pass filter ‘LPF1’ so that s(n) contains only the lower bass frequencies. Then, the full wave rectifier generates even-order harmonics $h_e(n)$ while the clipper generates odd-order harmonics $h_o(n)$. Those harmonics are added to form integral-order harmonics as $$h(n)=h_e(n)+Kh_o(n)$$

where K is a level-matching constant. The generated harmonics h(n) is passed to the output low-pass filter ‘LPF2’ to suppress extra harmonics that may lead to unpleasant noisy sound.

The peak detector ‘Peak’ works as an envelope estimator. Its output is used to eliminate dc (direct current) component of the full wave rectified signal, and to determine the clipping threshold. The following paragraphs describe the peak detection and the method of generating harmonics efficiently using the detected peak.

Figure 2G:
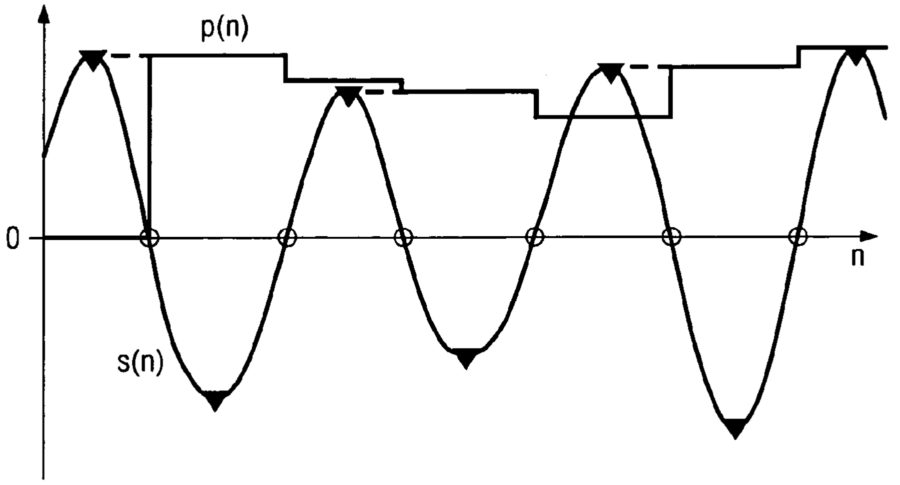
FIG. 2g (PRIOR ART)

The peak detector detects peak absolute value of the input signal s(n) during each half-wave. A half-wave means a section between neighboring zero-crossings. FIG. 2*g* presents an explanatory example. The circles mark zero-crossings, and the triangles show maximas during half-waves. The peak value detected during a half-wave will be output as p(n) during the subsequent half-wave. In other words, the output is updated at each zero-crossing with the peak absolute value during the most recent half-wave. Pseudo C code of the preferred embodiment peak detector.

```
sgn=1;
maxima=0;
p(−1)=0;
for (n=0; ; n++) {
maxima=max(maxima, fabs(s(n)));
if (sgn*s(n)<0) {
   p(n)=maxima;
   maxima=0;
   sgn=−sgn;
}
else {
   p(n)=p(n−1);
}
}
```

Figure 1K:
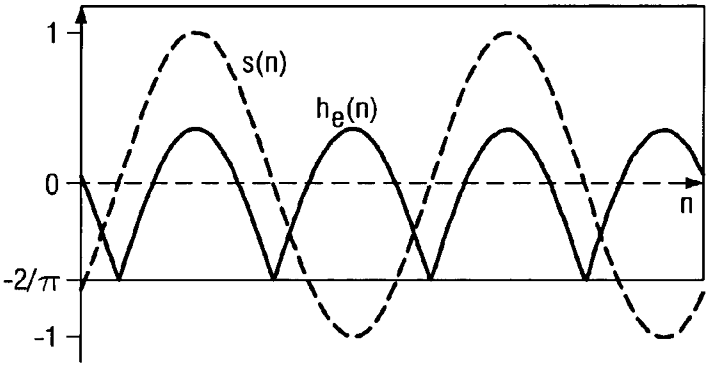

To generate even-order harmonics $h_e(n)$, the preferred embodiments employs the full wave rectifier. Namely it calculates absolute value of the input signal s(n). An issue of using the full wave rectifier is that the output cannot be negative and thus it has a positive offset that may lead to unreasonably wide dynamic range. The offset could be eliminated by using a high-pass filter. However, the filter should have steep cut-off characteristics in order to cut the dc offset while passing generated bass (i.e., very low) frequencies. The filter order will then be relatively high, and the computation cost will be increased. Instead, the preferred embodiments, in a more direct way, subtracts an estimate of the offset as $$h_e(n)=|s(n)|-\alpha p(n)$$

where $\alpha$ is a scalar multiple. From the derivation in the following section, the value of $\alpha$ is set to $2/\pi$. FIG. 1*k* shows $h_e(n)$ for the unit sinusoidal input as an example.

The frequency characteristics of $h_e(n)$ are analyzed for a sinusoidal input. Since the frequencies contained in s(n) and $h_e(n)$ are very low compared to the sampling frequency, the characteristics may be derived in the continuous time domain.

Let f(t) be a periodic function of period $2\pi$. Then, the Fourier series of f(t) is given by $$f(t)+a_0+\Sigma_{0<k<\infty}(a_k \cos kt+b_k \sin kt)$$

where the Fourier coefficients $a_k$, $b_k$ are $$a_0=\int_{-\pi<i<\pi}f(t)dt$$

$$a_k=\int_{-\pi<i<\pi}f(t)\cos kt\, dt$$

$$b_k=\int_{-\pi<i<\pi}f(t)\sin kt\, dt$$

Suppose that the unit sinusoidal function of the fundamental frequency, sin t, is fed to the foregoing full-wave rectifier with offset ($h_e(n)=|s(n)|-\alpha p(n)$). Note that the peak is always equal to 1 for input sin t. Then, computing the Fourier coefficients for $|\sin t|-\alpha$ a gives $$a_0^{(e)} = 2/\pi - \alpha.$$

$$a_k^{(e)} = 4/\pi(1-k^2) \text{ for } k \text{ even, positive}$$
$$= 0 \text{ for } k \text{ odd}$$

$$b_k^{(e)} = 0$$

Figure 1L:
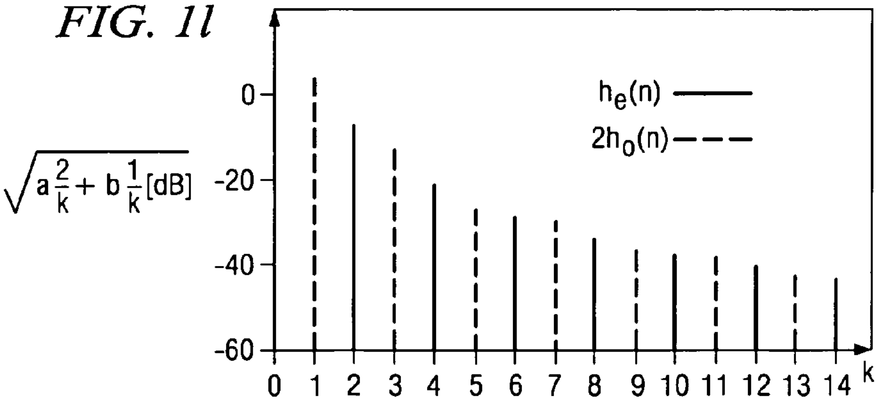

Hence, the full wave rectifier generates even-order harmonics. To eliminate the dc offset, $a_0^{(e)}$, $\alpha$ is set to $2/\pi$. in the preferred embodiments. The frequency spectrum of $h_e(n)$ is shown in FIG. 1*l* with the solid impulses.

To generate higher harmonics of odd-order, the preferred embodiment clips the input signal s(n) at a certain threshold T (T>0) as follows:

$$h_o(n) = T \quad \text{for } s(n) \geq T$$
$$= s(n) \quad \text{for } T > s(n) > -T$$
$$= -T \quad \text{for } -T \geq s(n)$$

Figure 1M:
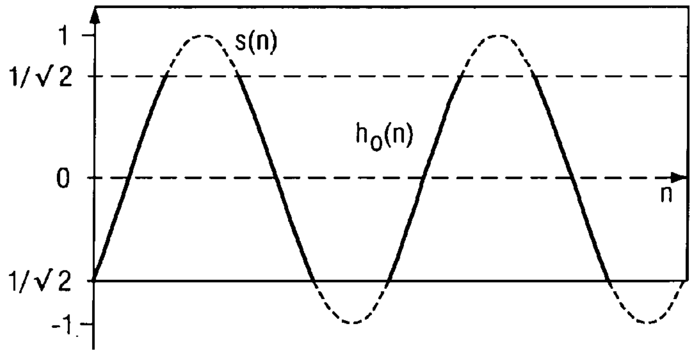

The threshold T should follow the envelope of the input signal s(n) to generate harmonics efficiently. It is thus time-varying and denoted by T(n) hereinafter. In the present invention, from the derivation in the following section, the threshold is determined as $$T(n)=\beta p(n)$$

where $\beta=1/\sqrt{2}$. FIG. 1*m* shows $h_o(n)$ for the unit sinusoidal input as an example.

The Fourier coefficients of a unit sinusoidal, sin t, clipped with the threshold T=sin $\theta$ are given by $$a_k^{(o)} = 0$$

$$b_1^{(o)} = 2(\theta + \sin\theta \cos\theta)/\pi$$

$$b_k^{(o)} = 4[\cos\theta \sin k\theta - (\sin\theta \cos k\theta)/k]/\pi(k^2-1) \text{ for } k \neq 1, \text{ odd}$$
$$= 0 \text{ for } k \text{ even}$$

Note that the clipping generates odd-order harmonics. The frequency spectrum of the clipped sinusoidal, $h_o(n)$, is shown in FIG. 1*l* with the dashed impulses, where $\theta=\pi/4$ and the spectrum is multiplied by two to equalize the magnitude level with $h_e(n)$. Similarity in the decay rate with respect to k can be observed between the spectra of $h_e(n)$ and $2h_e(n)$.

The similarity in the decay rate is suggested as follows. When the threshold parameter $\theta$ is set to $\theta=\pi/4$, the magnitude of the $k\neq1$, odd Fourier coefficients become $$|b_k^{(o)}|=2[1-(-1)^{(k-1)/2}/k]/\pi(k^2-1)$$

Since the 1/k term is small compared to the principal term due to $k\geqq3$, the following approximation holds $$2|b_k^{(o)}|=4/\pi(k^2-1) \text{ for } k\neq1, \text{ odd}$$

On the other hand, from $h_e(n)$ discussion $$|a_k^{(e)}|=4/\pi(1-k^2) \text{ for } k \text{ even, positive}$$

Thus the expressions for $|a_k^{(e)}|$ and $2|b_k^{(o)}|$ are identical except for the neglected term. Therefore, the frequency spectra of $h_e(n)$ and $2h_e(n)$ decay in a similar manner with respect to k. In the preferred embodiments, the constant K in and $\beta$ are so selected as K=2, $\beta=\sin \pi/4=1/\sqrt{2}$.

8. Experimental Results of Stereo BWE

Figure 4A:
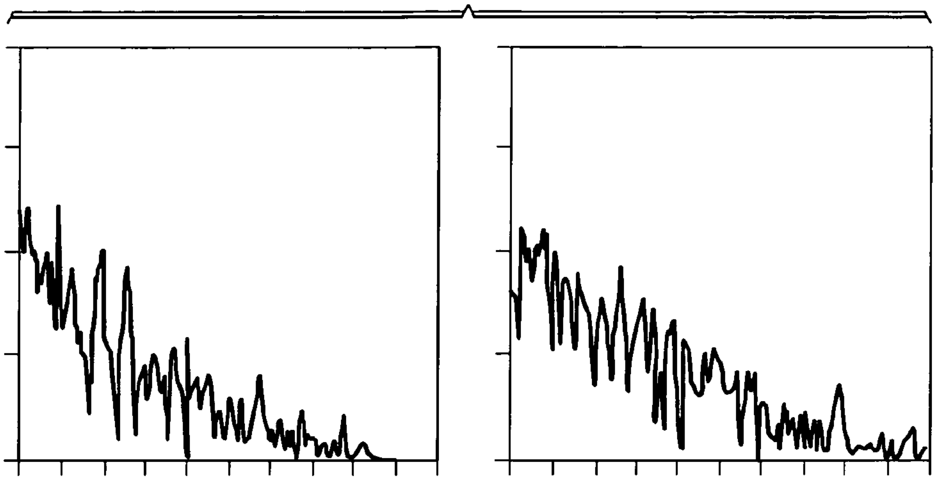
FIGS. 4*a*-4*c* are experimental results.
Figure 4B:
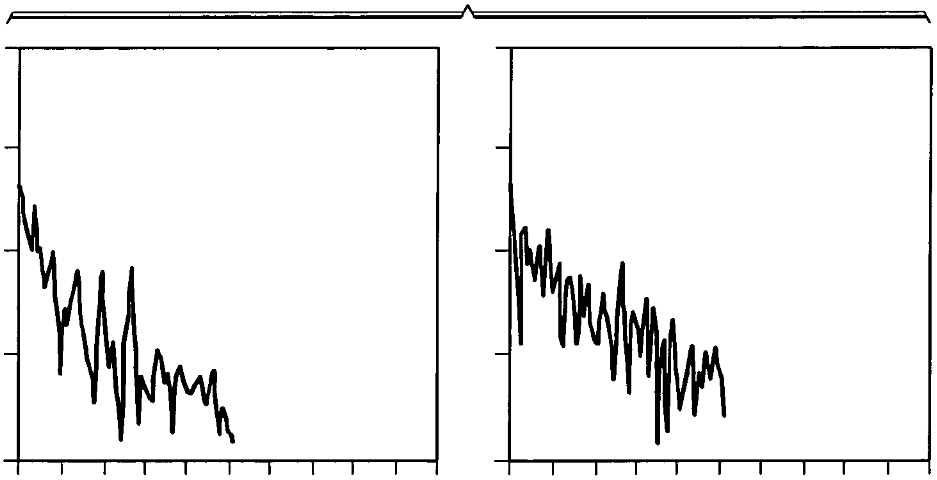
Figure 4C:
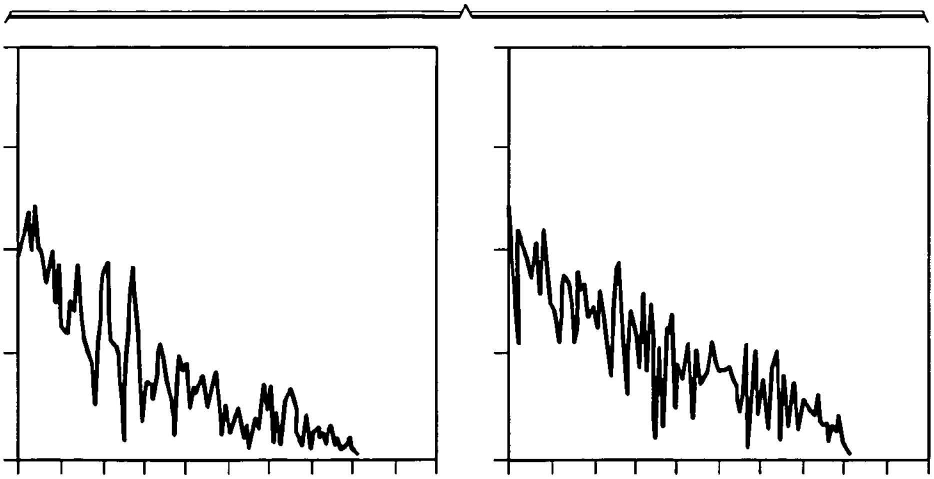

We implemented and tested the proposed method in the following steps: First, a stereo signal sampled at 44.1 kHz was low-pass filtered with cut-off frequency at 11.025 kHz (half the Nyquist frequency). This was used for an input signal to the proposed system. The frequency shift amount f, was chosen to be 5.5125 kHz. Therefore, the bandwidth of the output signal was set to about 16 kHz. We implemented the high-pass filters with an IIR structure. FIGS. 4*a*-4*c* show results regarding the spectrum shape. It is observed that the system well synthesizes the high frequency components above 11.025 kHz with smooth spectrum envelope. We also performed an informal listening test. We confirmed that the high-frequency band-expanded signal produced by a preferred embodiment system was comparable to the full-band original signal, and certainly sounded better than the low-pass filtered signal, which generated a darkened perception. Another listening test was conducted that compared our system with another system that applies the single channel BWE independently to the left and right channels. We detected almost no perceptual difference between them. This implies that the preferred embodiment method efficiently reduces computational cost with no quality degradation for stereo input.

9. Modifications

The preferred embodiments can be modified while retaining one or more of the features of adaptive high frequency signal level estimation, stereo bandwidth expansion with a common signal, cut-off frequency estimation with spectral curve fits, and bass expansion with both fundamental frequency illusion and frequency band equalization.

For example, the number of samples summed for the ratios defining the left and right channel gains can be varied from a few to thousands, the shift frequency can be roughly a target frequency (e.g., 20 kHz)—the cutoff frequency, the interpolation frequencies and size of averages for the cut-off verification could be varied, and the shape and amount of bass boost could be varied, and so forth.

What is claimed is:

1. A method of cut-off frequency estimation for audio signals, comprising the steps of:

(a) providing a candidate cut-off frequency from a peak power spectrum of an input frame of audio signals; and (b) verifying said candidate from a linear interpolation of averages of said spectrum for frequencies greater than said candidate plus a linear interpolation of averages of said spectrum for frequencies less than said candidate.

2. The method of claim 1, wherein said peak power spectrum of input frame is the maximum of (i) an attenuated peak power spectrum for a frame prior to said input frame and (ii) the squared magnitude of the transform of said audio signal in said input frame.

3. The method of claim 1, wherein said candidate is the largest frequency for which the peak power spectrum exceeds a threshold.

4. The method of claim 1 wherein with kc denoting said candidate, said averages of said spectrum for frequencies less than said candidate comprise (i) an average about kL1=kc−N/16 and (ii) an average about kL2=kc−3N/16 where N is the number of samples in said input frame.

5. A method of bandwidth expansion, comprising the steps of:

(a) adaptively estimating a cut-off frequency of an input audio signal;

(b) adaptively estimating a high frequency signal level for said input audio signal;

(c) replicating a portion of said input signal in a frequency band with said cut-off frequency as an endpoint; and (d) scaling said replicating with a gain determined from said high frequency signal level.

6. The method of claim 5, wherein said adaptively estimating a cut-off frequency includes the steps of:

(a) providing a candidate cut-off frequency from a peak power spectrum of an input frame of said input audio signal; and (b) verifying said candidate from a linear interpolation of averages of said spectrum for frequencies greater than said candidate plus a linear interpolation of averages of said spectrum for frequencies less than said candidate.

* * * * *